(12) United States Patent
Jiang et al.

(10) Patent No.: US 8,404,127 B2
(45) Date of Patent: Mar. 26, 2013

(54) ELECTRODE MATERIAL AND APPLICATIONS THEREOF

(75) Inventors: Yadong Jiang, Chengdu (CN); Tao Wang, Chengdu (CN); Deen Gu, Chengdu (CN); Kai Yuan, Chengdu (CN)

(73) Assignee: University of Electronic Science and Technology of China, Chengdu, Sichuan Province (CN)

( * ) Notice: Subject to any disclaimer, the term of this patent is extended or adjusted under 35 U.S.C. 154(b) by 344 days.

(21) Appl. No.: 12/831,110

(22) Filed: Jul. 6, 2010

(65) Prior Publication Data

US 2012/0006781 A1    Jan. 12, 2012

(51) Int. Cl.
*H01B 13/00*    (2006.01)
(52) U.S. Cl. .......................................... 216/13
(58) Field of Classification Search ...... 216/13
See application file for complete search history.

(56) References Cited

U.S. PATENT DOCUMENTS
2003/0071215 A1 *  4/2003  Ajisawa ............... 250/338.1

FOREIGN PATENT DOCUMENTS
JP          10150153 A  *  6/1998

* cited by examiner

*Primary Examiner* — Roberts Culbert

(57) ABSTRACT

A metal vanadium film is used as an extraction electrode contacting with a vanadium oxide or doped vanadium oxide film. The electrode material is adapted for a detector, sensor and optical switch based on a vanadium oxide or doped vanadium oxide film. The metal vanadium film is in favor of reducing the thermal conductivity of the support structure of the array unit. The preparation process of the vanadium film using the metal vanadium as the source material is more easily controlled than that of NiCr film using the NiCr alloy as the source material. The extraction electrode of the present invention easily obtains an excellent metal-semiconductor contact characteristic. The preparation process and patterning process of the metal vanadium film have an excellent technology compatibility with the IC and MEMS manufacturing processes.

18 Claims, 2 Drawing Sheets

ELECTRODE MATERIAL AND APPLICATIONS THEREOF

BACKGROUND OF THE PRESENT INVENTION

1. Field of Invention

The present invention relates to an electrode technology, and more particularly to an extraction electrode contacting with a vanadium oxide or doped vanadium oxide film, which is adapted for the electrode material of the detectors, sensors, optical switches and other devices based on the sensitive material of the vanadium oxide or doped vanadium oxide film.

2. Description of Related Arts

The vanadium oxide film, as a thermal resistance sensitive film, is widely used in fabricating the micro-bolometer uncooled focal plane array with excellent detection performance and corresponding un-cooled detector, owing to the advantages of (a) low 1/f noise, (b) high TCR (temperature coefficient of resistance) and (c) good technology compatibility with the MEMS process. Furthermore, the vanadium oxide, as a sensitive material, is also used to fabricate the THz detecting focal plane array adapted for THz band (0.1~10 THz) target detection and identification.

In addition, the vanadium oxide film has an excellent phase transition property at near room temperature. Before and after the phase transition temperature, the conductivity, optical absorption, refractive index, magnetic susceptibility, specific heat and other physical properties of the vanadium oxide film change sharply, so that the vanadium oxide film also has broad application prospects in temperature sensors, gas sensors, solar cell windows, electrochromic devices, optical switches and other fields.

In the high performance detectors, sensors, and other devices, many sensitive units are commonly arranged into an arrayed structure, wherein the specific form thereof depends on the application requirements of the devices. For example, the focal plane array based on the vanadium oxide sensitive film is generally made up of a group of two-dimensional pixel array, wherein every pixel includes a sensitive area and a support structure for supporting the sensitive area. The support structure not only provides the sensitive area with the mechanical support, but also is an important heat transfer path. When the radiation of the detected object is projected to the radiation absorption area of the sensitive unit, the radiation will be absorbed, thus the temperature of the sensitive area will increase. Simultaneously, the heat flows to surrounding environment by means of heat conduction, heat convection and heat radiation. This heat flow will reduce the temperature rise amplitude of the sensitive area, thus reducing the detector response. Accordingly, in order to obtain high detection performance, the array is generally sealed in the vacuum shell, and every pixel in the array is spaced from each other. Therefore, the heat conduction passing through the support structure to the substrate becomes the main heat loss way of the pixel. Moreover, the support structure is also affiliated with electronic conductive paths, namely, pixel electrodes.

To obtain the un-cooled focal plane array with high detection performance, its pixel electrode material generally requires a high electrical conductivity, a low thermal conductivity, a good ohmic contact with the sensitive material, a preparation method with a good compatibility with MEMS and IC processes and so on. At present, the commonly used electrode materials in the vanadium oxide focal plane array are NiCr film, Ti film and so on, among which the NiCr film has become the most commonly used electrode material in the vanadium oxide focal plane array owing to its good oxidation resistance. However, the NiCr film has a large elastic modulus, so that the NiCr film has a large residual stress, thus resulting in the warping of the array unit and other deformations. Furthermore, relatively speaking, the NiCr film has a larger thermal conductivity, so that the detection performance of the vanadium oxide focal plane array is reduced to a certain extent. Therefore, a new electrode material for the vanadium oxide focal plane array is expected to further improve the detection performance of the vanadium oxide focal plane array.

Furthermore, for the manufacturing process of the arrayed sensor, micro-optical switch and other devices based on vanadium oxide, it is important to select an electrode material having an excellent process compatibility with the IC and MEMS processes. The dry etching equipment and etching process commonly used in the traditional IC technological process are difficult to meet the requirement of the NiCr film patterning, so that the process compatibility of the NiCr film electrode is reduced to a certain degree, thus limiting the combination of the manufacturing processes of various devices based on vanadium oxide with the traditional IC process.

SUMMARY OF THE PRESENT INVENTION

An object of the present invention is to provide an electrode material which is used as an electrode contacting with a vanadium oxide or doped vanadium oxide film, so that the device based on the vanadium oxide or doped vanadium oxide film has an excellent process compatibility, high process stability, and excellent performance.

Accordingly, in order to accomplish the above object, the present invention provides a method for preparing an electrode material, comprising the step of using a metal vanadium film as an extraction electrode contacting with a vanadium oxide or doped vanadium oxide film.

Also, a method for fabricating a composite structure of an electrode/a vanadium oxide or doped vanadium oxide film layer/a passivation layer using a lower electrode mode, comprises the steps of:

(1) preparing a metal vanadium film on a substrate;
(2) forming a patterned vanadium electrode for the metal vanadium film;
(3) applying an in-situ vacuum pretreatment to the patterned vanadium electrode;
(4) preparing a vanadium oxide or doped vanadium oxide film on the pretreated patterned vanadium electrode;
(5) preparing a layer of Silicon Oxynitride (SiON) passivation film on the vanadium oxide or doped vanadium oxide film; and
(6) patterning the vanadium oxide or doped vanadium oxide film and the passivation film to obtain the composite structure of the electrode/the vanadium oxide or doped vanadium oxide sensitive film/the passivation layer.

A method for fabricating a composite structure of a vanadium oxide or doped vanadium oxide film/an electrode/a passivation layer using an upper electrode mode, comprises the steps of:

(A) preparing a vanadium oxide or doped vanadium oxide film on a substrate;
(B) preparing a layer of Silicon Oxynitride (SiON) passivation film on the vanadium oxide or doped vanadium oxide film;
(C) opening an electrode contact hole on the layer of Silicon Oxynitride (SiON) passivation film;

(D) applying an in-situ vacuum pretreatment to a vanadium oxide or doped vanadium oxide film at the electrode contact hole;
(E) preparing a metal vanadium film on the pretreated structure;
(F) preparing a layer of Silicon Nitride passivation film on the metal vanadium film, consequently forming a multilayer film; and
(G) patterning the multilayer film to form the composite structure of the vanadium oxide or doped vanadium oxide film/the electrode/the passivation layer.

In the present invention, the preparation of the metal vanadium film can be performed by DC sputtering, RF sputtering, vacuum evaporation and ion beam deposition. The passivation layer of the metal vanadium film is a Silicon Nitride film deposited by the CVD process. The methods of patterning the metal vanadium film include stripping method, dry etching method and wet etching method.

In the step of applying the in-situ vacuum pretreatment to the metal vanadium electrode, the patterned vanadium electrode is bombarded for 30 seconds~500 seconds by an argon ion beam with an accelerating voltage of 100V~500V in a vacuum chamber with a base pressure less than $1.0 \times 10^{-2}$ Pa, and then the sample is transferred into a deposition process vacuum chamber for depositing the vanadium oxide or doped vanadium oxide film.

The present invention has some beneficial effects as follows. Firstly, considering the demands for the electrode materials of the vanadium oxide focal plane array, the metal vanadium film is used as the electrode material contacting with the vanadium oxide or doped vanadium oxide film. The thermal conductivity of the electrode material is about the third one of NiCr, so that this is favorable for reducing the heat transfer by the support structure of the array unit, thus significantly improving the performance of the vanadium oxide detector. Secondly, the preparation process of vanadium film, using the metal vanadium as the source material (target, evaporation source), is more easily controlled than that of NiCr film, using the NiCr alloy as the source material. It is laborious to find the optimal composition of the NiCr alloy target used for the preparation of electrode films. Thirdly, by using the metal vanadium film as the electrode contacting with the vanadium oxide or doped vanadium oxide film, it is easy to obtain an excellent metal-semiconductor contact characteristic, thus facilitating fabricating a low-noise device based on the vanadium oxide or doped vanadium oxide sensitive film. Furthermore, using the metal vanadium film as the electrode contacting with the vanadium oxide or doped vanadium oxide film, also improves the compatibility of the manufacturing processes of various devices, based on the vanadium oxide or doped vanadium oxide sensitive film, with IC and MEMS processes. All in all, using the metal vanadium film as the electrode contacting with the vanadium oxide or doped vanadium oxide film provides the condition for further improving the performance of the devices based on the vanadium oxide or doped vanadium oxide sensitive film, and the compatibility of manufacturing process.

In the present invention, using the metal vanadium film as the electrode contacting with the vanadium oxide or doped vanadium oxide film, can have two contact modes of a lower electrode mode and an upper electrode mode. In the lower electrode mode, the method of fabricating a composite structure of a metal vanadium film electrode/a vanadium oxide or doped vanadium oxide sensitive film, comprises the steps of: preparing a metal vanadium film on a substrate, forming a patterned electrode for the metal vanadium film, applying an in-situ vacuum pretreatment to the patterned vanadium electrode, preparing a vanadium oxide or doped vanadium oxide film on the pretreated patterned vanadium electrode, preparing a layer of Silicon Oxynitride (SiON) passivation film on the vanadium oxide or doped vanadium oxide film, and patterning the vanadium oxide or doped vanadium oxide film and the layer of passivation film to obtain the composite structure of the electrode/the vanadium oxide or doped vanadium oxide sensitive film/the passivation layer. In the upper electrode mode, the method of fabricating a composite structure of a vanadium oxide or doped vanadium oxide sensitive film/a metal vanadium film electrode, comprises the steps of: preparing a vanadium oxide or doped vanadium oxide film on a substrate, preparing a layer of Silicon Oxynitride (SiON) passivation film on the vanadium oxide or doped vanadium oxide film, opening an electrode contact hole on the layer of passivation film, applying an in-situ vacuum pretreatment to a vanadium oxide at the contact hole, preparing a metal vanadium film on the pretreated structure, preparing a layer of Silicon Nitride passivation film on the metal vanadium film consequently forming a multilayer film, and patterning the multilayer film to form the composite structure with the vanadium oxide or doped vanadium oxide film as a sensitive film, and a metal vanadium film as an upper electrode.

These and other objectives, features, and advantages of the present invention will become apparent from the following detailed description, the accompanying drawings, and the appended claims.

DETAILED DESCRIPTION OF THE PREFERRED EMBODIMENT

Example 1

Figure 1:
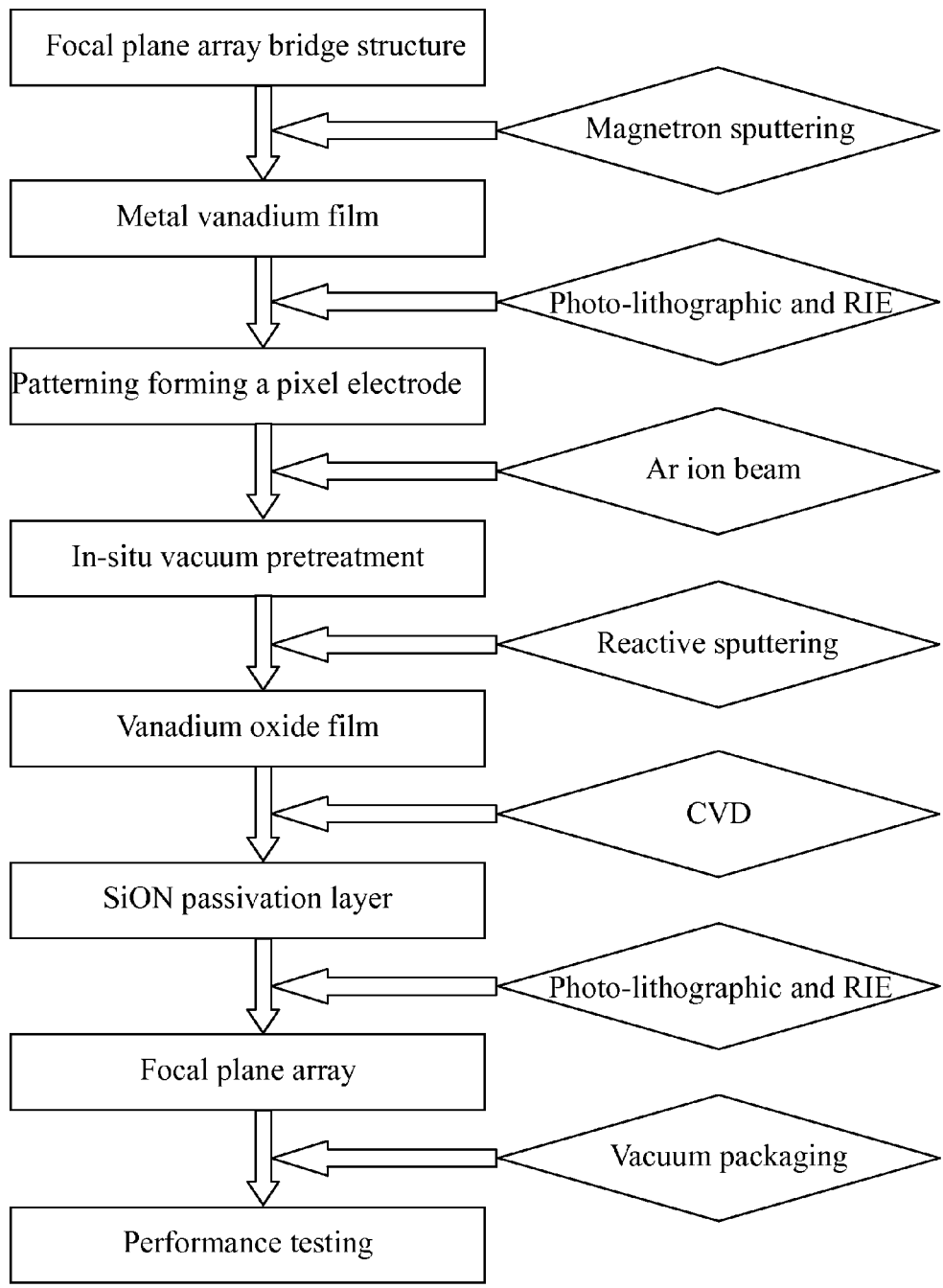
FIG. 1 is a schematic diagram of the manufacturing process of an un-cooled infrared focal plane array according to a first preferred embodiment of the present invention, illustrating a lower electrode manufacturing method for preparing the un-cooled infrared focal plane array using a metal vanadium film as a pixel lower electrode and using a vanadium oxide or doped vanadium oxide film as a sensitive film.

Referring to the FIG. 1, an un-cooled infrared focal plane array according to a first preferred embodiment of the present invention is illustrated.

A 128×128 focal plane array bridge structure with a pixel size of 50×50 μm is formed on a substrate by the MEMS process, and its bridge deck is a 500 nm Silicon Nitride film deposited by the CVD process. Then a 200 nm metal vanadium film is deposited on the Silicon Nitride film by the DC magnetron sputtering process. And then a pixel electrode with a line width of 2.0 μm is formed by the photo-lithographic process and reactive ion etching process. The patterned electrode is bombarded for 1 minute by an argon ion beam with an energy of 450 eV and a beam density of 3 mA/cm$^2$, and then the sample is directly put into the sputtering chamber, and then a vanadium oxide film, with a film thickness of 160 nm and a sheet resistance of 20 k-Ω/□, is deposited by the reactive sputtering process. A layer of Silicon Oxynitride (SiON)

passivation film with a film thickness of 20 nm is deposited on the vanadium oxide film by the CVD process. The pixel unit is patterned by integrating the photo-lithographic process with the reactive ion etching process to form an un-cooled infrared focal plane array using the metal vanadium film as the pixel lower electrode and using the vanadium oxide film as the sensitive film. After a vacuum packaging of the un-cooled infrared focal plane array, a performance testing is performed by a 5 µs, 200 µA bias pulse under the environment with an operating temperature of 25° C. The noise equivalent temperature difference (NETD) of this un-cooled infrared focal plane array is 62 mK.

Example 2

Figure 2:
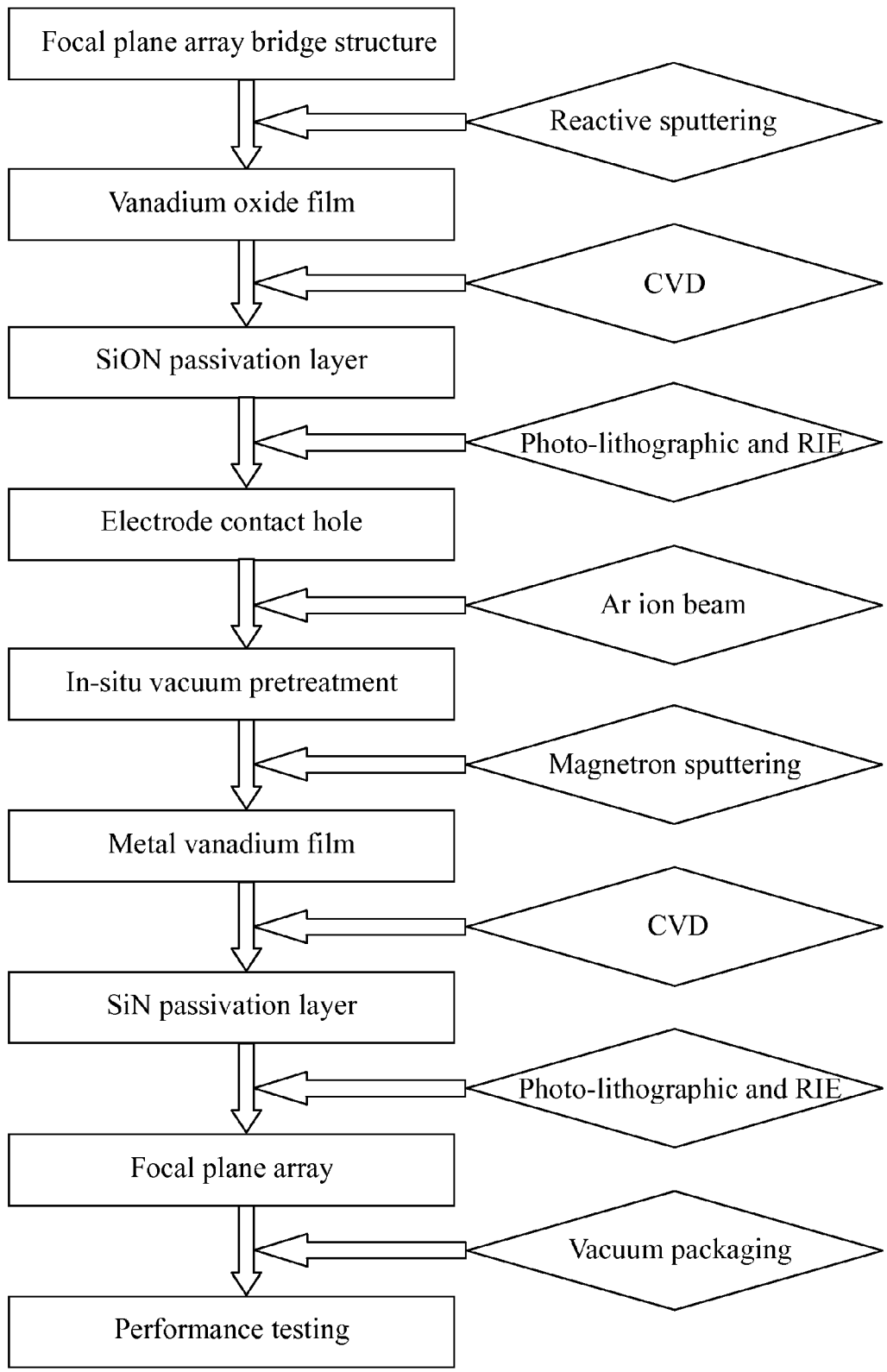
FIG. 2 is a schematic diagram of the manufacturing process of an un-cooled infrared focal plane array according to a second preferred embodiment of the present invention, illustrating an upper electrode manufacturing method for preparing the un-cooled infrared focal plane array using a metal vanadium film as a pixel upper electrode and using a vanadium oxide or doped vanadium oxide film as a sensitive film.

Referring to the FIG. 2, an un-cooled infrared focal plane array according to a second preferred embodiment of the present invention is illustrated.

A 128×128 focal plane array bridge structure with a pixel size of 50×50 µm is formed on a substrate by the MEMS process, and its bridge deck is a 500 nm Silicon Nitride film deposited by the CVD process. A vanadium oxide film with a film thickness of 160 nm and a sheet resistance of 25 k$\Omega$/□ is deposited by the reactive sputtering process. Then a layer of Silicon Oxynitride (SiON) passivation film with a film thickness of 20 nm is deposited on the vanadium oxide film by the CVD process. An electrode contact hole is opened on the layer of passivation film by integrating the photo-lithographic process with the reactive ion etching process. The patterned electrode is bombarded for 2 minutes by an argon ion beam with an energy of 400 eV and a beam density of 5 mA/cm$^2$, then the sample is directly put into the sputtering chamber, and then a 200 nm metal vanadium film is deposited by the DC magnetron sputtering. A layer of Silicon Nitride passivation film with a film thickness 20 nm is deposited on the metal vanadium film by the CVD process. Then the pixel unit is patterned by integrating the photo-lithographic process with the reactive ion etching process to form an un-cooled infrared focal plane array using the metal vanadium film as the pixel upper electrode and using the vanadium oxide film as the sensitive film. After a vacuum packaging of the un-cooled infrared focal plane array, a performance testing is performed by a 5 µs, 200 µA bias pulse under the environment with an operating temperature of 25° C. The noise equivalent temperature difference (NETD) of this un-cooled infrared focal plane array is 56 mK.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method for fabricating a composite structure of an electrode/a vanadium oxide or doped vanadium oxide film/a passivation layer using a lower electrode mode, comprising the steps of:
    (1) preparing a metal vanadium film on a substrate;
    (2) forming a patterned vanadium electrode for the metal vanadium film;
    (3) applying a in-situ vacuum pretreatment to the patterned vanadium electrode;
    (4) preparing a vanadium oxide or doped vanadium oxide film on the pretreated patterned vanadium electrode;
    (5) preparing a layer of Silicon Oxynitride passivation film on the vanadium oxide or doped vanadium oxide film; and
    (6) patterning the vanadium oxide or doped vanadium oxide film and the layer of passivation film to obtain the composite structure of the electrode/the vanadium oxide or doped vanadium oxide sensitive film/the passivation layer.

2. The method, as recited in claim 1, wherein in the in-situ vacuum pretreatment to the metal vanadium electrode, the patterned vanadium electrode is bombarded for 30 seconds~500 seconds by an argon ion beam with an accelerating voltage of 100V~500V in a vacuum chamber with a base pressure less than 1.0×10$^{-2}$ Pa, and then the sample is transferred, under vacuum, into a deposition process vacuum chamber for depositing the vanadium oxide or doped vanadium oxide film.

3. The method, as recited in claim 1, wherein the preparation of the metal vanadium film is a method selected from the group consisting of DC sputtering, RF sputtering, vacuum evaporation and ion beam deposition, in step (1).

4. The method, as recited in claim 3, wherein in the in-situ vacuum pretreatment to the metal vanadium electrode, the patterned vanadium electrode is bombarded for 30 seconds~500 seconds by an argon ion beam with an accelerating voltage of 100V~500V in a vacuum chamber with a base pressure less than 1.0×10$^{-2}$ Pa, and then the sample is transferred, under vacuum, into a deposition process vacuum chamber for depositing the vanadium oxide or doped vanadium oxide film.

5. The method, as recited in claim 1, wherein the patterning of the metal vanadium film is a method selected from the group consisting of stripping method, dry etching method and wet etching method, in step (2).

6. The method, as recited in claim 5, wherein in the in-situ vacuum pretreatment to the metal vanadium electrode, the patterned vanadium electrode is bombarded for 30 seconds~500 seconds by an argon ion beam with an accelerating voltage of 100V~500V in a vacuum chamber with a base pressure less than 1.0×10$^{-2}$ Pa, and then the sample is transferred, under vacuum, into a deposition process vacuum chamber for depositing the vanadium oxide or doped vanadium oxide film.

7. The method, as recited in claim 3, wherein the patterning of the metal vanadium film is a method selected from the group consisting of stripping method, dry etching method and wet etching method, in step (2).

8. The method, as recited in claim 7, wherein in the in-situ vacuum pretreatment to the metal vanadium electrode, the patterned vanadium electrode is bombarded for 30 seconds~500 seconds by an argon ion beam with an accelerating voltage of 100V~500V in a vacuum chamber with a base pressure less than 1.0×10$^{-2}$ Pa, and then the sample is transferred, under vacuum, into a deposition process vacuum chamber for depositing the vanadium oxide or doped vanadium oxide film.

9. A method for fabricating a composite structure of a vanadium oxide or doped vanadium oxide film/an electrode/a passivation layer using an upper electrode mode, comprising the steps of:
    (A) preparing a vanadium oxide or doped vanadium oxide film on a substrate;

(B) preparing a layer of Silicon Oxynitride (SiON) passivation film on the vanadium oxide or doped vanadium oxide film;

(C) opening an electrode contact hole on the layer of Silicon Oxynitride (SiON) passivation film;

(D) applying an in-situ vacuum pretreatment to a vanadium oxide or doped vanadium oxide film at the electrode contact hole;

(E) preparing a metal vanadium film on the pretreated structure;

(F) preparing a layer of Silicon Nitride passivation film on the metal vanadium film, consequently forming a multilayer film; and (G) patterning the multilayer film to form the composite structure of the vanadium oxide or doped vanadium oxide film/the electrode/the passivation layer.

10. The method, as recited in claim 9, wherein the layer of Silicon Nitride passivation film on the metal vanadium film is formed by a CVD process, in step (F).

11. The method, as recited in claim 9, wherein the patterning of the metal vanadium film is a method selected from the group consisting of stripping method, dry etching method and wet etching method, in step (G).

12. The method, as recited in claim 9, wherein in the in-situ vacuum pretreatment to the vanadium oxide or doped vanadium oxide film, the vanadium oxide or doped vanadium oxide film at the electrode contact hole is bombarded for 30 seconds~300 seconds by an argon ion beam with an accelerating voltage of 100V~400V in a vacuum chamber with a base pressure less than $1.0 \times 10^{-2}$ Pa, and then the sample is put, under vacuum, into a metal vanadium film deposition process vacuum chamber.

13. The method, as recited in claim 9, wherein the preparation of the metal vanadium film is a method selected from the group consisting of DC sputtering, RF sputtering, vacuum evaporation and ion beam deposition, in step (E).

14. The method, as recited in claim 13, wherein the patterning of the metal vanadium film is a method selected from the group consisting of stripping method, dry etching method and wet etching method, in step (G).

15. The method, as recited in claim 13, wherein in the in-situ vacuum pretreatment to the vanadium oxide or doped vanadium oxide film, the vanadium oxide or doped vanadium oxide film at the electrode contact hole is bombarded for 30 seconds~300 seconds by an argon ion beam with an accelerating voltage of 100V~400V in a vacuum chamber with a base pressure less than $1.0 \times 10^{-2}$ Pa, and then the sample is put, under vacuum, into a metal vanadium film deposition process vacuum chamber.

16. The method, as recited in claim 13, wherein the layer of Silicon Nitride passivation film on the metal vanadium film is formed by a CVD process, in step (F).

17. The method, as recited in claim 16, wherein the patterning of the metal vanadium film is a method selected from the group consisting of stripping method, dry etching method and wet etching method, in step (G).

18. The method, as recited in claim 17, wherein in the in-situ vacuum pretreatment to the vanadium oxide or doped vanadium oxide film, the vanadium oxide or doped vanadium oxide film at the electrode contact hole is bombarded for 30 seconds~300 seconds by an argon ion beam with an accelerating voltage of 100V~400V in a vacuum chamber with a base pressure less than $1.0 \times 10^{-2}$ Pa, and then the sample is put, under vacuum, into a metal vanadium film deposition process vacuum chamber.

* * * * *